United States Patent [19]

Tsujimoto

[11] Patent Number: 5,295,111
[45] Date of Patent: Mar. 15, 1994

[54] DYNAMIC RANDOM ACCESS MEMORY DEVICE WITH IMPROVED POWER SUPPLY SYSTEM FOR SPEED-UP OF REWRITING OPERATION ON DATA BITS READ-OUT FROM MEMORY CELLS

[75] Inventor: Akira Tsujimoto, Tokyo, Japan

[73] Assignee: NEC Corporation, Tokyo, Japan

[21] Appl. No.: 692,832

[22] Filed: Apr. 29, 1991

[30] Foreign Application Priority Data

Apr. 27, 1990 [JP] Japan ............................ 2-112402

[51] Int. Cl.5 ..................... G11C 7/00; G11C 8/00
[52] U.S. Cl. ............................... 365/226; 365/194; 365/208
[58] Field of Search .............. 365/226, 63, 205, 190, 365/207, 208, 194

[56] References Cited

U.S. PATENT DOCUMENTS

| | | | |
|---|---|---|---|
| 4,918,663 | 4/1990 | Remington et al. | 365/226 |
| 5,022,005 | 6/1991 | Tohnishi | 365/226 |
| 5,027,324 | 6/1991 | Seo | 365/194 |
| 5,051,958 | 9/1991 | Arakawa | 365/226 |
| 5,053,998 | 10/1991 | Kannan et al. | 365/194 |
| 5,132,932 | 7/1992 | Tobita | 365/226 |

FOREIGN PATENT DOCUMENTS 4-067391  3/1992  Japan ............................ 365/226

*Primary Examiner*—William L. Sikes
*Assistant Examiner*—Toan Tran
*Attorney, Agent, or Firm*—Sughrue, Mion, Zinn, Macpeak & Seas

[57] ABSTRACT

A random access memory device includes a plurality of memory cells arranged in matrix and sense amplifier circuits for data bits read-out from a row of the memory cells, and sense amplifier circuits are provided in association with sense amplifier driving circuits selectively incorporated in a first controlling unit provided in association with row address bits for supporting propagation of the data bits. A second controlling unit is provided in association with column address bits for supporting propagation of one of the data bits to an input-and-output data buffer unit, wherein the first and second controlling units are coupled in parallel between a bonding pad supplied with a power voltage and another bonding pad supplied with a ground voltage so that the sense amplifier circuits achieve differential amplification at an improved speed.

7 Claims, 8 Drawing Sheets

DYNAMIC RANDOM ACCESS MEMORY DEVICE WITH IMPROVED POWER SUPPLY SYSTEM FOR SPEED-UP OF REWRITING OPERATION ON DATA BITS READ-OUT FROM MEMORY CELLS

FIELD OF THE INVENTION

This invention relates to a dynamic random access memory device and, more particularly, to a power supply system incorporated in the random access memory device.

DESCRIPTION OF THE RELATED ART

Miniaturization has enhanced the integration density of a semiconductor memory device. A dynamic random access memory device is suitable for the ultra-large scale integration because of the simple structure of the memory cell. The random access memory device is inexpensive in view of cost per bit, and there is a great demand for the inexpensive random access memory device. Moreover, system composers expect to develop a high-speed random access memory, and sense amplifier circuits need to speed up the dynamic random access memory device. Various approaches have been proposed so as to improve the sense amplifier circuits.

FIG. 1 shows a typical example of the dynamic random access memory device. A plurality of sense amplifier circuits SA1, SA2 and SAn are incorporated in the random access memory device and are connectable through bit line pairs BLP1, BLP2 and BLPn to memory cells M1, M2 and Mn, respectively. A transfer gate unit 1 is inserted between the sense amplifier circuits SA1 to SAn and the memory cells M1 to Mn, and isolates the sense amplifier circuits SA1 to SAn from parasitic capacitances respectively coupled to the bit line pairs BLP1 to BLPn in the presence of a first control signal CTL1 of a low voltage level. However, while the first control signal CTL1 remains in a high voltage level, all of the component n-channel type field effect transistors Qn11, Qn12, Qn21, Qn22, Qnn1 and Qnn2 of the transfer gate unit 1 are turned on to interconnect the sense amplifier circuits SA1 to SAn and the memory cells M1 to Mn. Thus, the bit line pairs BLP1 to BLPn are divided into two groups of bit line sections with respect to the transfer gate unit 1, and the bit line sections coupled to the memory cells M1 to Mn are referred to as "first bit line sections BLS11 to BLS1n". The other bit line sections are referred to as "second bit line sections BLS21 to BLS2n".

Each of the sense amplifier circuits SA1 to SAn comprises first and second series combinations of p-channel type field effect transistors Qp31 and Qp32 and n-channel type field effect transistors Qn33 and Qn34 coupled in parallel between first and second voltage lines 2 and 3, and the common drain nodes N1 and N2 are coupled to the gate electrodes in the second and first series combinations, respectively. The first and second voltage lines 2 and 3 are respectively coupled through resisters R1 and R2 to a sense amplifier driving circuit 4. The sense amplifier driving circuit 4 comprises a p-channel switching transistor Qp35, an n-channel type switching transistor Qn36 and an inverter circuit 5 coupled between the gate electrode of the n-channel type switching transistor Qn36 and the gate electrode of the p-channel type switching transistor Qp35. Then, the switching transistors Qp35 and Qn36 concurrently turn on and off depending upon a second control signal CTL2, and the first and second voltage lines 2 and 3 are respectively connectable to first and second voltage sources Vc1 and Vs1.

Each of the memory cells M1 to Mn is implemented by a series combination of an n-channel type switching transistor Qn37 and a storage capacitor CP coupled between either bit line of the associated bit line pair and a ground node, and a word line WL is shared between the memory cells M1 to Mn. Although the memory cells are arranged in a plurality of rows respectively associated with word lines, only a single row of the memory cells M1 to Mn as well as the associated word line WL are shown in FIG. 1. The word line WL remains in a low voltage level in so far as row address bits do not designate the word line WL, however, the word line WL goes up to an active high voltage level upon designation with the row address bits.

Since a data bit is stored in one of the memory cells M1 to Mn in the form of electric charges, the data bit is liable to be lost during a long idle state, and a refreshing phase is provided during the operation of the random access memory device. Description is hereinbelow made on the refreshing phase of the prior art random access memory device with reference to FIG. 2 of the drawings. In the refreshing phase, data bits are concurrently read out from all of the memory cells M1 to Mn coupled to one of the word lines designated by the row address bits, however, the description is focused upon the memory cell M1 on the assumption that a data bit of logic "0" level is stored therein.

If a row address strobe signal goes down from an inactive high voltage level to an active low voltage level at time t1, the row address bits are latched in the prior art random access memory device, and the row address bits allow the word line WL to go up to the high voltage level at time t2. The bit line pairs BLP1 to BLPn had been precharged, and the bit line pairs BLP1 to BLPn were thereafter isolated from a precharging circuit (not shown). The switching transistors Qn37 of the memory cells M1 to Mn concurrently turn on to couple the storage capacitors CP to the second bit line sections BLS21 to BLS2n. Since the source node of the switching transistor Qn37 of the memory cell M1 is lower than the drain node thereof, a small amount of decay dV takes place on the second bit line section BLS21 at time t3, and the decay dV is propagated through the transfer gate unit 1 to the first bit line section BLS11. The decay dV is calculated as follows $$dV = \{CS/(CB+CS)\} \times (Vx - Vcc/2)$$

where CS is the capacitance of the storage capacitor CP, CB is the parasitic capacitance coupled to one of the component bit lines of the associated bit line pair BLP1, Vx is the voltage level at the storage capacitor CP, Vcc/2 is the precharging voltage level on the bit line pair BLP1, and Vcc is the power voltage level.

At time t4, the second control signal CTL2 goes up to the high voltage level, and the p-channel switching transistor Qp35 and the n-channel switching transistor Qn36 turn on to couple the first and second voltage sources Vc1 and Vs1 to the first and second voltage lines 2 and 3, respectively. Then, the sense amplifier circuit SA1 as well as the other sense amplifier circuits SA2 to SAn are activated to increase the small difference dV. However, the large parasitic capacitance CB does not allow rapidly increasing the small difference dV. The first control signal CTL1 goes down to the low voltage level at time t5, and the sense amplifier circuit SA1 is isolated from the second bit line section BLS21 by the transfer gate unit 1. Since the parasitic capacitance coupled to the second bit line section BLS21 is cut from the sense amplifier circuit SA1, the sense amplifier circuit SA1 rapidly increases the small difference dV. The first bit line section BLS11 is driven to the power voltage level Vcc and the ground level Vss, however, the second bit line section BLS21 remains in the small difference dV.

At time t6, the row address strobe signal is recovered to the inactive high voltage level, and the first control signal CTL1 goes up to the high voltage level at time t7. Then, the n-channel type field effect transistors Qn11 to Qnn2 concurrently turn on to interconnect the first bit line sections BLS11 to BLS1n to the second bit line sections BLS21 to BLS2n. Since the word line WL remains high, the memory cell M1 is electrically coupled to the second bit line section BLS21 and, accordingly, to the sense amplifier circuit SA1. The sense amplifier circuit SA1 drives the second bit line section BLS21 as well as the storage capacitor CP of the memory cell M1, and the sense amplifier circuit SA1 starts on increasing the small difference dV on the second bit line section BLS21 at time t8. Namely, current is supplied from the first voltage source Vc1 through either p-channel type field effect transistor Qp31 or Qp32 to either component bit line of the bit line pair BLP1, and electric charges are discharged from the other component bit line through either n-channel type field effect transistor Qn33 or Qn34 to the second voltage source Vs1. The word line WL is recovered to the low voltage level Vss at time t9, and the data bit read-out from the memory cell M1 is rewritten into the memory cell M1 again.

Thus, the data bit read on the bit line pair BLP1 in the form of electric charges is rewritten into the memory cell M1 from time t8 to time t9, and t1 stands for the time period for rewriting the data bit. The data bits read out from the other memory cells M2 to Mn are refreshed in a similar manner to the data bit stored in the memory cell M1.

Although the description is made on the refreshing phase of the prior art random access memory device, the data bits read out from the memory cells M1 to Mn are subjected to the difference amplification with the sense amplifier circuits SA1 to SAn in a read-out phase.

As described hereinbefore, development efforts are being made for high speed random access memory device, and the sense amplifier circuits SA1 to SAn are implemented by large-sized field effect transistors QP31, Qp32, Qn33 and Qn34 so as to accelerate the charging and discharging operations through the sense amplifier circuits SA1 to SAn. However, even though the sense amplifier circuits SA1 to SAn are fabricated by using large-sized field effect transistors Qp31, Qp32, Qn33 and Qn34, the time period t1 is hardly shrunk affected, and the time period t1 sets a limitation on the speed-increase for the random access memory device. If the time period t1 is decreased beyond the critical value, the voltage difference on the second bit line section BLS21 is not large enough to conserve a bit of data information represented by the original data bit as shown in FIG. 2. (Compare the second bit line section BLS21 with the first bit line section BLS11.)

The inventor analyzed the problem inherent in the prior art random access memory device, and found that the power supply system incorporated in the prior art random access memory device is causative of the limitation. In detail, FIG. 3 shows the power supply system incorporated in the prior art random access memory device, and the power voltage level Vcc and the ground voltage level Vss are respectively supplied to bonding pads Vcc and Vss. The power voltage level Vcc and the ground voltage level Vss are supplied in parallel to a controlling unit 6 provided in association with the row address bits and a controlling unit 7 associated with column address bits through highly resistive components R3, R4, R5 and R6. The highly resistive components R3 and R4 decay the power voltage level and the ground voltage level, and, accordingly, the first and second voltage sources Vc1 and Vs1 take place between the highly resistive components R3 and R4 and the controlling unit 6. The sense amplifier driving circuit 4 is incorporated in the controlling unit 6, and the first and second voltage sources Vc1 and Vs1 are coupled through the controlling unit 6 as well as the resistors R1 and R2 to the sense amplifier circuits SA1 to SAn. The parallel arrangement of the power supply system eliminates undesirable interference from controlling signals independently produced by the controlling units 6 and 7.

While the sense amplifier circuits SA1 to SAn drive the bit line pairs BLP1 to BLPn, current is supplied from the bonding pad Vcc through the highly resistive component R3, the resistor R1, and either p-channel type field effect transistor Qp31 or Qp32 of every sense amplifier circuits SA1 to SAn to either bit line of the associated bit line pair, and electric charges accumulated in the other bit line of the associated bit line pair is discharged through either n-channel type field effect transistor Qn33 or Qn34 of every sense amplifier circuit SA1 to SAn and the resister R2 and the highly resistive component R4 to the bonding pad Vss. Thus, only the single current path charges up the bit lines of all of the bit line pairs BLP1 to BLPn, and the other bit lines of all the bit line pairs are discharged through the single current path. The highly resistive component R3 and the resistor R1 limit the current supplied to the sense amplifier circuits SA1 to SAn, and the resistor, R2 and the highly resistive component R4 restrict the discharging current. Even if the component transistors of each sense amplifier circuit SA1 to SAn are enlarged, the resistors, R1 and R2 and the highly resistive components R3 and R4 never allow shrinking the time period t1.

SUMMARY OF THE INVENTION

It is therefore an important object of the present invention to provide a random access memory device which is improved in rewriting operation on data bits read-out from the memory cells.

To accomplish the object, the present invention proposes to provide dual current paths between sense amplifier circuits and bonding pads respectively supplied with power and ground voltage levels.

In accordance with the present invention, there is provided a random access memory device comprising a) a plurality of dynamic memory cells arranged in rows and columns and storing data bits in the form of electric charges, respectively, b) a plurality of bit line pairs respectively coupled to the columns of the dynamic memory cells, and propagating small differences in voltage level corresponding to data bits, c) a plurality of sense amplifier circuits coupled to the bit line pairs, respectively, and selectively providing first current paths for charging current and second current path for discharging current, thereby increasing the small differences in voltage level on the bit line pairs, d) a first controlling unit provided in association with row address bits and supporting propagation of data bits for a row of the dynamic random access memory cells, e) a second controlling unit provided in association with column address bits and supporting propagation of one of the data bits for the row of the dynamic random access memory cells, the first and second controlling units being coupled in parallel between a first pad supplied with a first voltage level and a second pad supplied with a second voltage level, wherein the first current paths and the second current paths of the sense amplifier circuits are electrically coupled to the first and second pads, respectively, through a plurality of driving circuits selectively incorporated in the first and second controlling units.

BRIEF DESCRIPTION OF THE DRAWINGS

The features and advantages of the random access memory device according to the present invention will be more clearly understood from the following description taken in conjunction with the accompanying drawings in which.

DESCRIPTION OF THE PREFERRED EMBODIMENTS

First Embodiment

Figure 1:
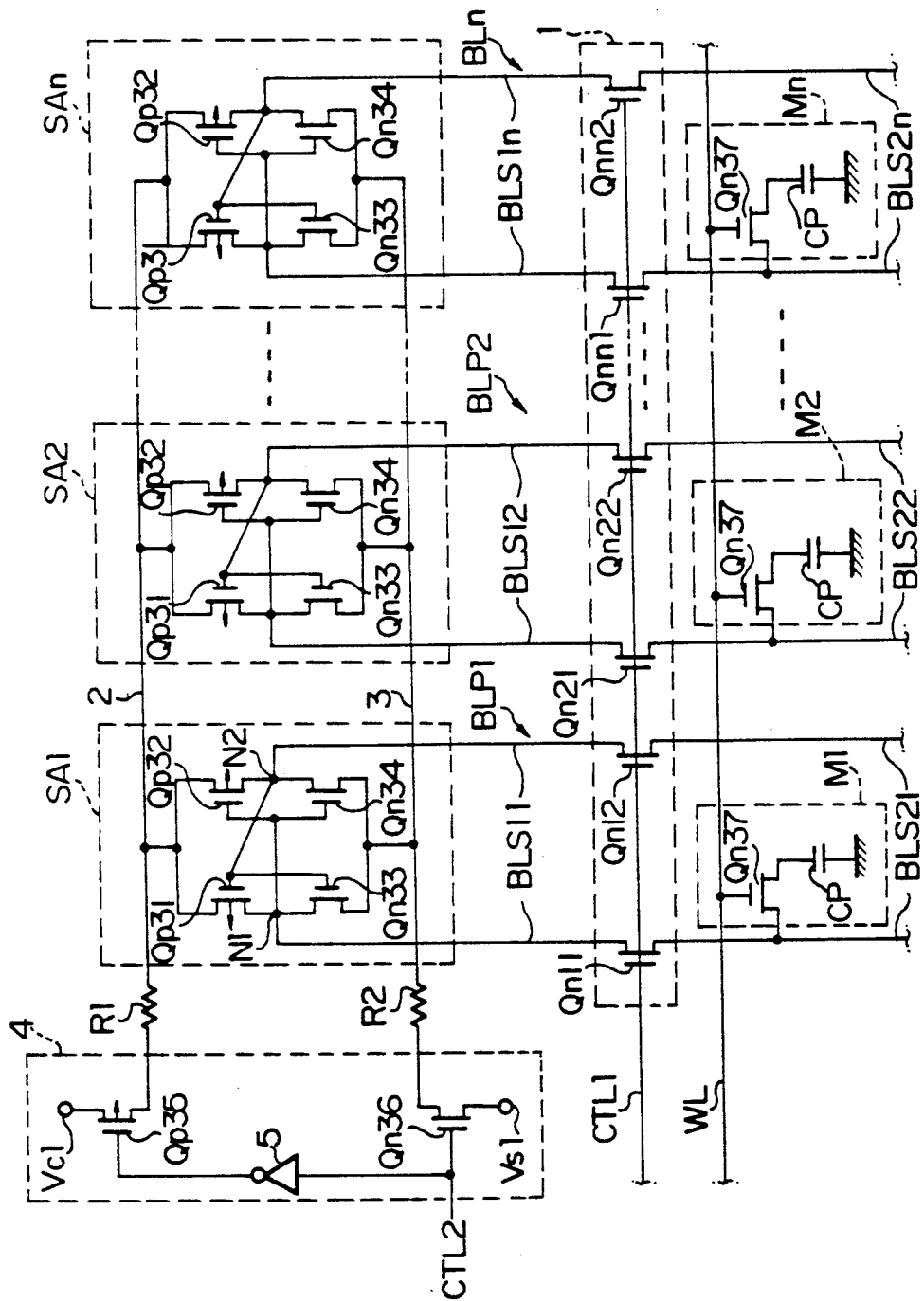
FIG. 1 is a circuit diagram showing the arrangement of the prior art random access memory device.
Figure 2:
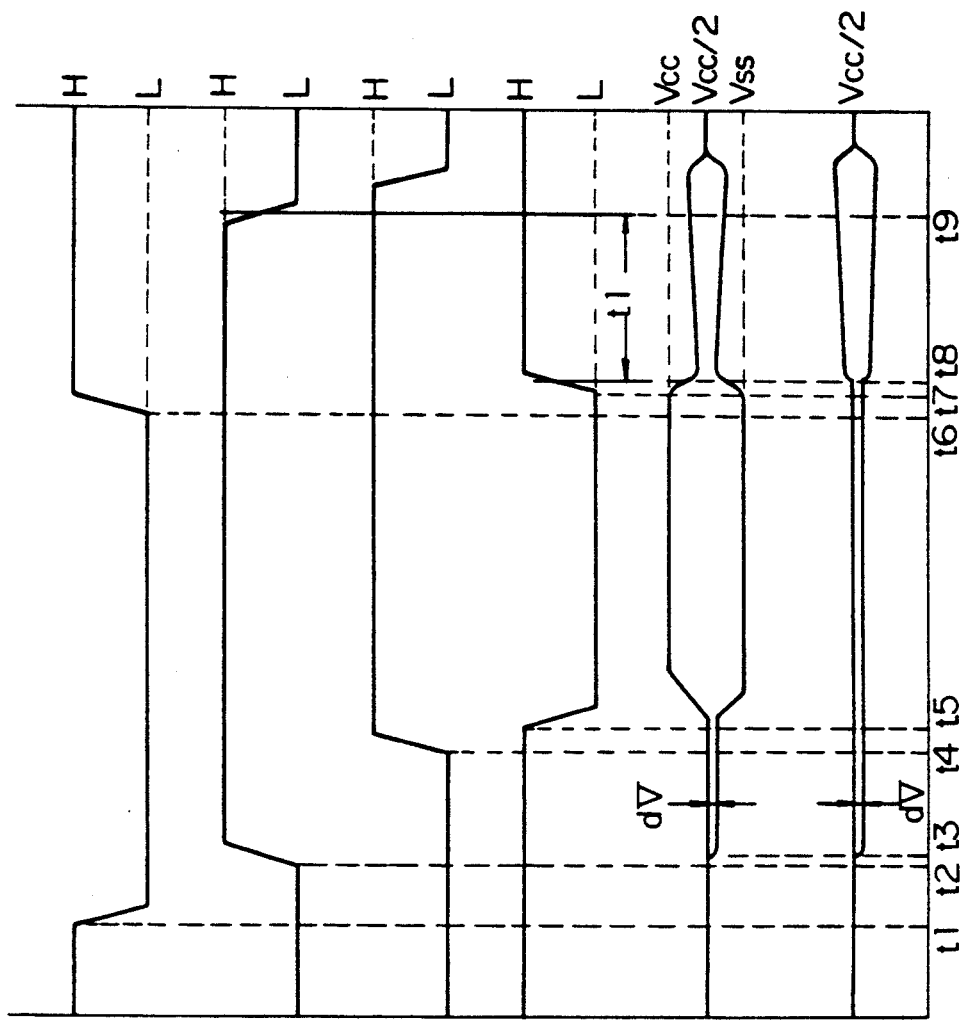
FIG. 2 is a diagram showing the waveforms produced in the prior art random access memory device in a refreshing phase.
Figure 3:
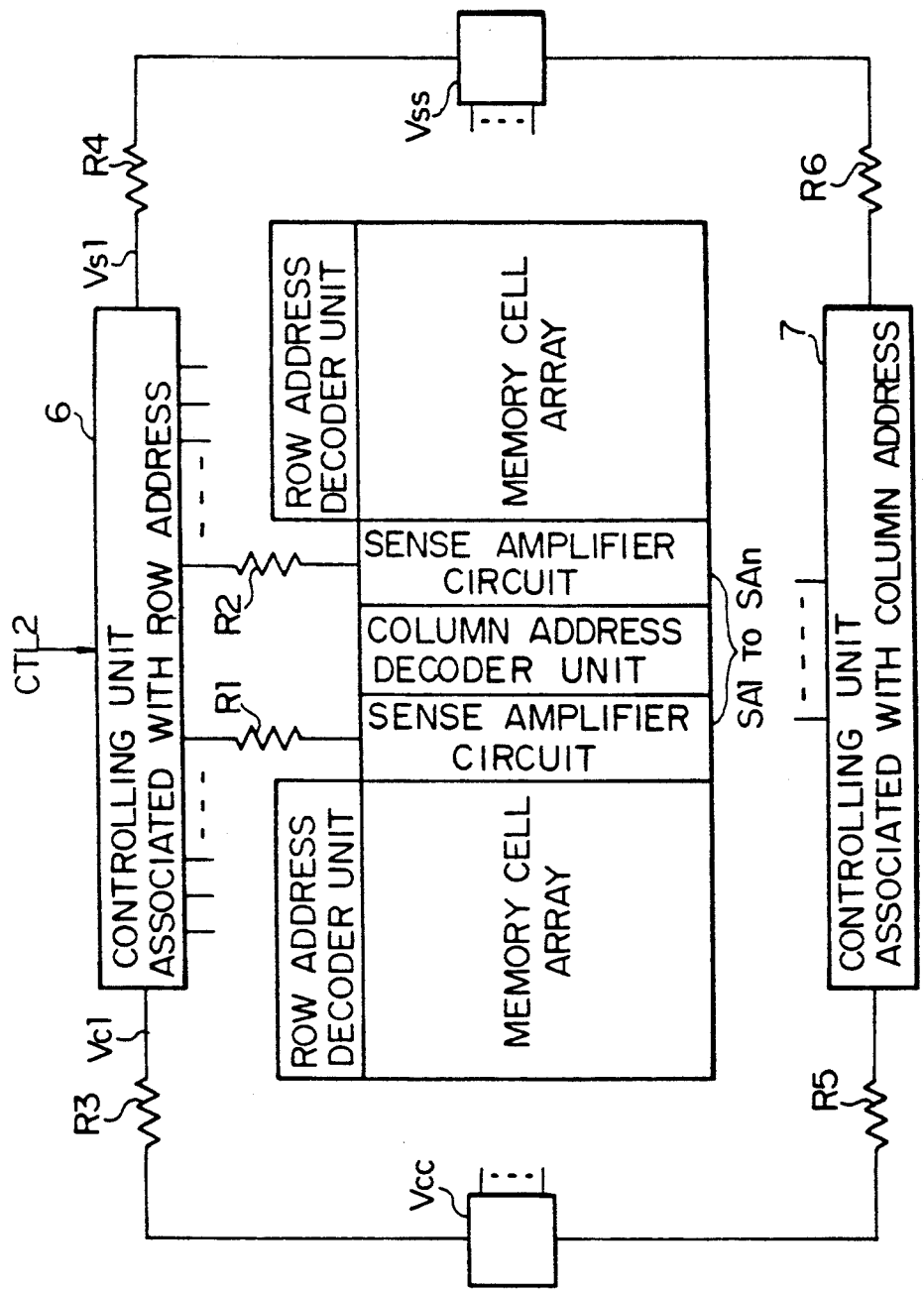
FIG. 3 is a distribution diagram showing the power supply system of the prior art random access memory device.
Figure 4:
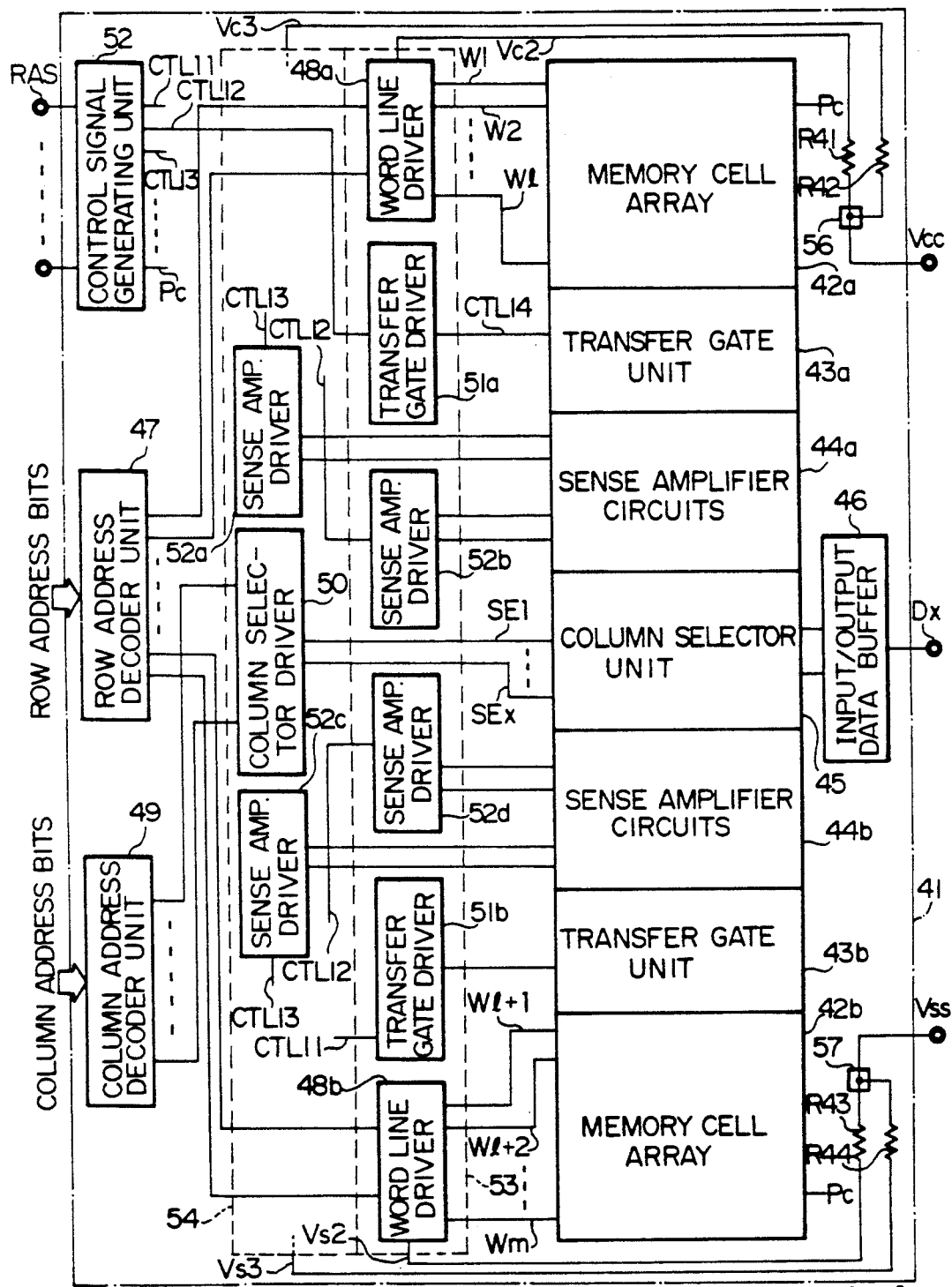
FIG. 4 is a block diagram showing the arrangement of a random access memory device according to the present invention.

Referring to FIG. 4 of the drawings, a random access memory device embodying the present invention is fabricated on a single semiconductor chip 41. The random access memory device shown in FIG. 4 comprises memory cell arrays 42a and 42b coupled through respective transfer gate units 43a and 43b to sense amplifier units 44a and 44b, respectively. The sense amplifier units 44a and 44b in turn are connectable through a column selector unit 45 to an input-and-output buffer unit 46, and the input-and-output buffer unit 46 is coupled to a data pin Dx.

The random access memory device further comprises a row address decoder unit 47 responsive to row address bits for controlling word line driver circuits 48a and 48b, and a column address decoder unit 49 responsive to column address bits for controlling column selector driver circuit 50. The word line driver circuits 48a and 48b selectively drive word lines W1, W2, . . . , W1, W1+1, W1+2, . . . and Wm under the control of the row address decoder unit 47. The column selector driver circuit 50 produces a selecting signal SE1 to SEx under the control of the column address decoder unit 49, and supplies the selecting signal SE1 to SEx to the column selector unit 45.

The transfer gate units 43a and 43b are associated with transfer gate driver circuits 51a and 51b, and the transfer gate driver circuits 51a and 51b cause the transfer gate units 43a and 43b to concurrently turn on and off in response to a first control signal CTL11 fed from a control signal generating unit 52. Various external control signals such as a row address strobe signal RAS are supplied to the control signal generating unit 52, and the control signal generating unit 52 sequentially produces internal control signals. The first control signal CTL11 is one of the internal control signals, and other important internal control signals are second and third control signals CTL12 CTL13 selectively fed to sense amplifier driver circuits 52a, 52b, 52c and 52d. The second control signal CTL12 allows the sense amplifier driver circuits 52b and 52d to couple first and third voltage sources Vc2 and Vs2 to the sense amplifier circuits 44a and 44b, and the third control signal CTL13 allows the sense amplifier driver circuits 52a and 52c to interconnect the sense amplifier circuits 44a and 44b and the second and fourth voltage sources Vc3 and Vs3 as will be described in detail hereinbelow.

The control signal generating unit 52 produces a precharging signal Pc, and the precharging signal Pc controls a precharging operation for the memory cell arrays 42a and 42b. Although the control signal generating unit 52 further produces the other internal control signals, the other internal control signals are not directly related with the novel features of the present invention, and, for this reason, no further description is made on the other internal control signals.

In this instance, the sense amplifier driver circuits 52b and 52d are incorporated in a first controlling unit 53 provided in association with the row address bits for supporting propagation of data bits read-out or written into a row of memory cells incorporated in the memory cell array 42a or 42b. The word line driver circuits 48a and 48b and the transfer gate driver circuits 51a and 51b are further incorporated in the first controlling unit 53, and the first controlling unit 53 is coupled to the first and third voltage sources Vc2 and Vs2. On the other hand, sense amplifier driver circuits 52a and 52c are incorporated in a second controlling unit 54 provided in association with the column address bits for supporting propagation of a data bit read-out or written into one of the row of the memory cells. In this instance, the column selector driver circuit 50 is further incorporated in the second controlling unit 54, and is coupled between the second and fourth voltage sources Vc3 and Vs3. The first and third voltage sources Vc2 and Vc3 are coupled in parallel to a bonding pad 56 which in turn is coupled to a power voltage pin Vcc. The second and fourth voltage sources Vc3 and Vs3 are coupled in parallel to a bonding pad 57 which in turn is coupled to a ground pin Vss. The dual power supply system.

Figure 5:
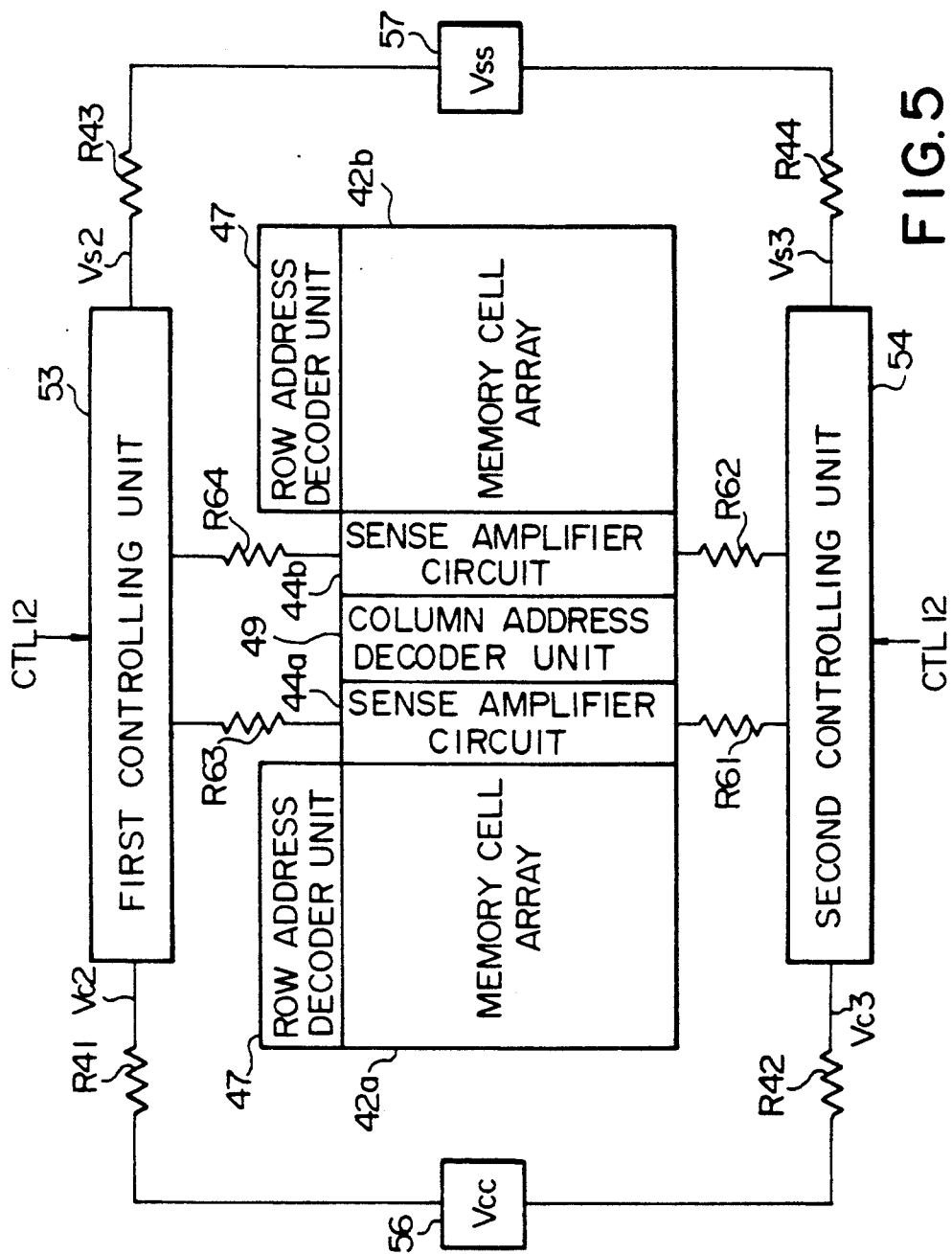
FIG. 5 is a distribution diagram showing the power supply system incorporated in the random access memory device shown in FIG. 4.

Thus, the sense amplifier driver circuits 52a and 52d are selectively incorporated in the first and second controlling units 53 and 54, and the power supply system incorporated in the random access memory device is summarized in FIG. 5. The bonding pad 56 is coupled through first and second highly resistive components R41 and R42 to the first and second controlling units 53 and 54, respectively, and the power voltage level Vcc is lowered by the highly resistive components R41 and R42 so that the first and second voltage sources Vc2 and Vc3 take place between the highly resistive components R41 and R42 and the first and second controlling units 53 and 54, respectively. The bonding pad 57 is also coupled through highly resistive components R43 and R44 to the first and second controlling units 53 and 54, respectively, and the third and fourth voltage sources Vs2 and Vs3 take place between the highly resistive components R43 and R44 and the first and second controlling units 53 and 54.

Thus, the first and second controlling units 53 and 54 and, accordingly, the sense amplifier driver circuits 52b/52d and 52a/52c are supplied with current from the power voltage source or the pad 56 through the first and second voltage sources Vc2 and Vc3, and discharge current to the ground voltage source or pad 57 through the third and fourth voltage sources Vs2 and Vs3. Since the current consumed by all of the sense amplifier circuits 44a and 44b are branched into two independent paths, the sense amplifier circuits 44a and 44b carry out the difference amplifications at an improved speed.

Figure 6:
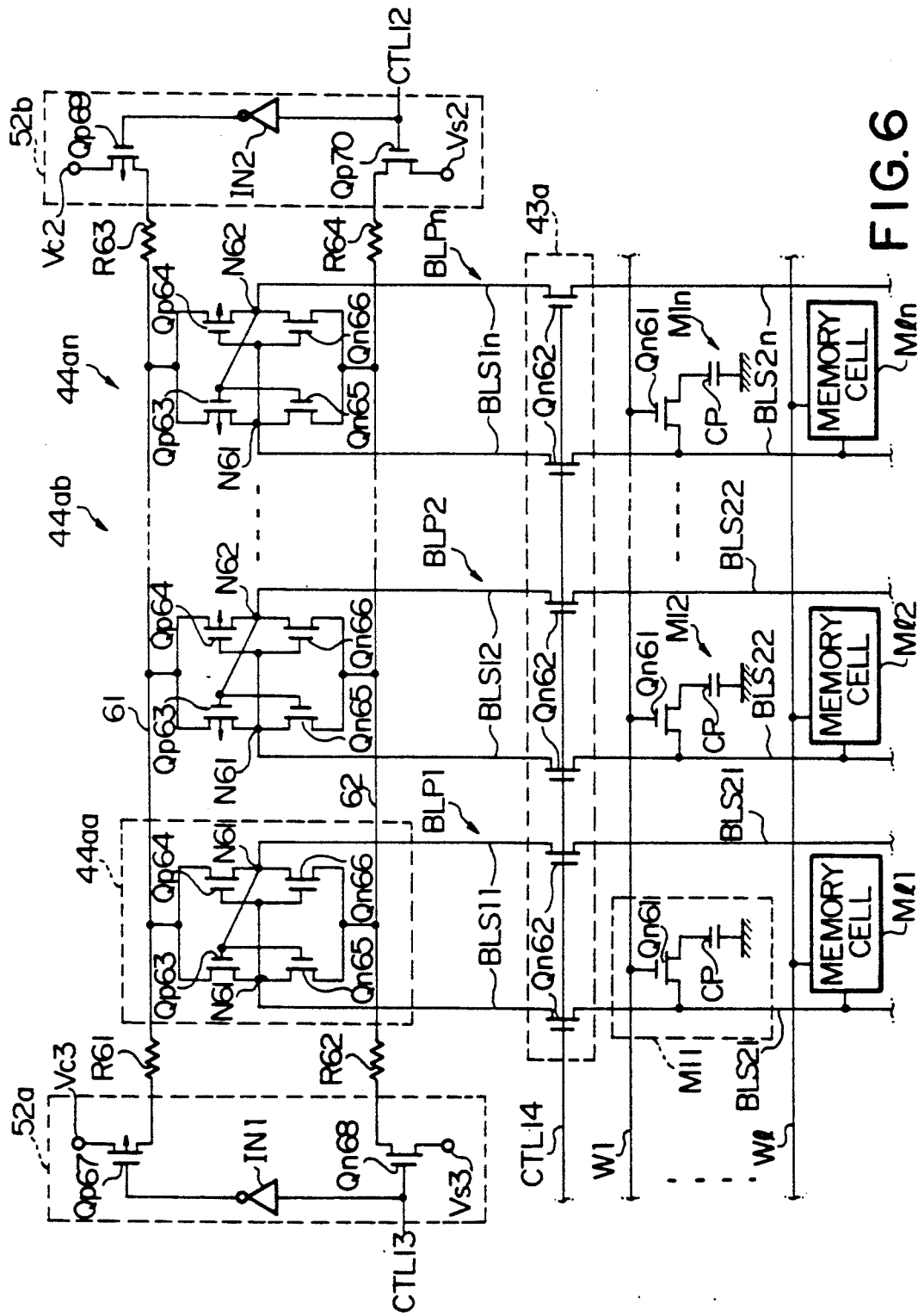
FIG. 6 is a circuit diagram showing the arrangement of an essential part of the random access memory device shown in FIG. 4.

Turning to FIG. 6 of the drawings, an essential part of the random access memory device is illustrated. Dynamic memory cells M11, M12, M1n, M11, M12 and M1n are incorporated in the memory cell array 42a, and each of the dynamic memory cells M11 to M1n is implemented by a series combination of an n-channel type switching transistor Qn61 and a storage capacitor CP. The switching transistors Qn61 of the rows of the dynamic memory cells M11 to M1n are respectively coupled to the word lines W1 to W1, and the word lines W1 to W1 are selectively driven by the word line driver circuit 48a.

The columns of the dynamic memory cells M11 to M1n are coupled to bit line pairs BLP1, BLP2, . . . and BLPn, and the bit line pairs BLP1 to BLPn propagate data bits to sense amplifier circuits 44aa, 44ab, . . . and 44an which are represented by the box labeled with 44a in FIG. 4. The transfer gate unit 43a divides the bit line pairs BLP1 to BLPn into first and second bit line sections BLS11 to BLS1n and BLS21 to BLS2n, and comprises a plurality of n-channel type transfer gate transistors Qn62 coupled between the first and second bit line sections BLS11 to BLS1n and BLS21 to BLS2n. A fourth control signal CTL13 is supplied to the gate electrodes of all of the n-channel type transfer gate transistors Qn62, and the n-channel type transfer gate transistors Qn62 concurrently turn on and off to interconnect the first and second bit line sections BLS11 to BLS2n.

Each of the sense amplifier circuits 44aa to 44an comprises two series combinations of p-channel type field effect transistors Qp63 and Qp64 and n-channel type field effect transistors Qn65 and Qn66 coupled in parallel between first and second voltage lines 61 and 62, and the common drain nodes N61 and N62 of the two series combinations are coupled to not only the associated bit line pair BLP1, BLP2 or BLPn but also the gate electrodes in a cross coupled manner, The left ends of the first and second voltage lines 61 and 62 are coupled through resistors R61 and R62 to the sense amplifier driver circuit 52a, and the first and second voltage lines 61 and 62 further coupled at the opposite ends to resistors R63 and R64 which in turn are coupled to the sense amplifier driver circuit 52b. The sense amplifier driver circuit 52a comprises a p-channel type field effect transistor Qp67 coupled between the second voltage source Vc3 and the resistors R61, an n-channel type field effect transistor Qn68 coupled between the fourth voltage source Vs3 and the resistors R62, and an inverter circuit IN1 coupled between the gate electrodes of the field effect transistors Qp67 and Qn68, and the third control signal CTL13 is supplied to the gate electrode of the n-channel type field effect transistor Qn68 and, accordingly, to the cathode of the inverter circuit IN1. The sense amplifier driver circuit 52b also comprises a p-channel type field effect transistor Qp69 coupled between the first voltage source Vc2 and the resistor R63, an n-channel type field effect transistor Qn70 coupled between the third voltage source Vs2 and the resistor R64, and an inverter circuit IN2 coupled between the gate electrodes of the field effect transistors Qp69 and Qn70, and the second control signal CTL12 is supplied to the gate electrode of the n-channel type field effect transistor Qn70 and, accordingly, to the cathode of the inverter circuit IN2. The memory cell array 42b, the transfer gate unit 43b, the sense amplifier circuits 44b and the sense amplifier driver circuits 52c and 52d are similar to that shown in FIG. 6, and detailed description is omitted for the sake of simplicity.

Figure 7:
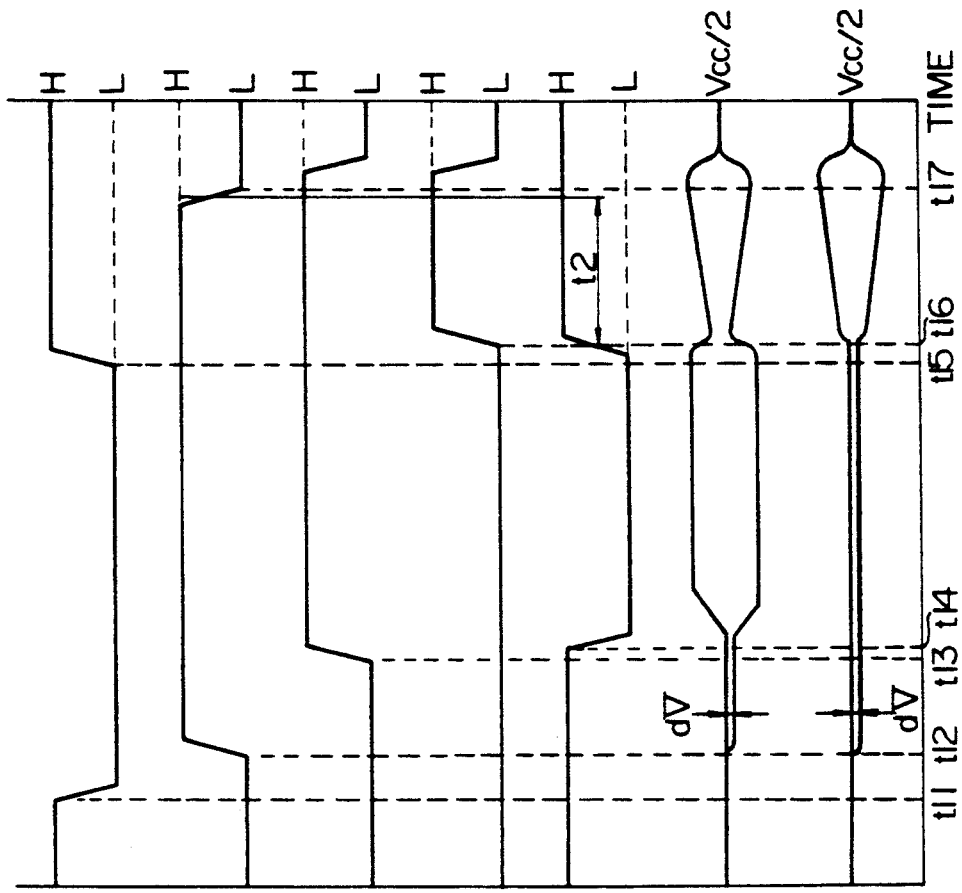
FIG. 7 is a diagram showing the waveforms of essential signals produced in the random access memory device shown in FIG. 4.

The random access memory device selectively enters a refreshing phase, a read-out phase and a write-in phase, and description is made on the refreshing phase with reference to FIG. 7. Although no description is incorporated for the read-out phase and the write-in phase, the propagation of data bits analogizes with the refreshing phase.

If the row address strobe signal RAS goes down from an inactive high voltage level to an active low voltage level at time t11, the row address bits are latched in the row address decoder unit 47, and the row address bits allow the word line driver circuit 48a to lift up one of the word lines WL1 to Wm. In an exemplary case, the word line W1 goes up to a high voltage level at time t12. Although not shown in the drawings, the memory cell arrays 42a and 42b are associated with respective precharging units. The precharging signal PC had caused the precharging unit to precharge the bit line pairs BLP1 to BLPn to the precharging voltage level Vcc/2, and the bit line pairs BLP1 to BLPn were isolated from the precharging circuit. The switching transistors Qn61 of the memory cells M11 to M1n concurrently turn on to couple the storage capacitors CP to the second bit line sections BLS21 to BLS2n. Since the source node of the switching transistor Qn61 of the memory cell M11 is lower than the drain node thereof, a small amount of decay dV takes place on the second bit line section BLS21 immediately after time t12, and the decay dV is propagated through the transfer gate unit 43a to the first bit line section BLS11.

At time t13, the second control signal CTL12 goes up to a high voltage level, and the p-channel type field effect transistor Qp69 and the n-channel type field effect transistor Qn70 turn on to couple the first and third voltage sources Vc2 and Vs2 to the first and second voltage lines 61 and 62, respectively. Then, the sense amplifier circuit 44aa as well as the other sense amplifier circuits 44ab to 44an are activated to increase the small difference dV on the bit line pairs BLP1 to BLPn. Namely, the n-channel type field effect transistor Qn65 and the p-channel type field effect transistor Qp64 of the sense amplifier circuit 44aa increase the channel conductances thereof and provide first and second current paths to the first and second voltage lines 61 and 62, respectively. However, the large parasitic capacitance coupled to the bit line pair BLP1 does not allow rapidly increasing the small difference dV. The fourth control signal CTL14 goes down to the low voltage level Vss at time t14, and the sense amplifier circuits 44aa to 44an are isolated from the second bit line sections BLS21 to BLS2n by the transfer gate unit 43a. Since the parasitic capacitance coupled to the second bit line section BLS21 is cut from the sense amplifier circuit 44aa, the sense amplifier circuit 44aa rapidly increases the small difference dV. The first bit line section BLS11 is driven to the power voltage level Vcc and the ground level Vss, however, the second bit line section BLS21 remains in the small difference dV.

At time t15, the row address strobe signal is recovered to an inactive high voltage level, and the fourth control signal CTL14 goes up to a high voltage level immediately after time t15. Then, the n-channel type field effect transistors Qn62 concurrently turn on to interconnect the first bit line sections BLS11 to BLS1n to the second bit line sections BLS21 to BLS2n. Since the word line WL1 remains high, the memory cell M11 is electrically coupled to the second bit line section BLS21 and, accordingly, to the sense amplifier circuit 44aa. The sense amplifier circuit 44aa needs to drive the second bit line section BLS21 as well as the storage capacitor CP of the memory cell M11. In this instance, the third control signal CTL13 goes up to a high voltage level at time t16, and the sense amplifier driving circuit 52a interconnects the second and fourth voltage sources Vc3 and Vs3 to the first and second voltage lines 61 and 62, respectively. The small difference dV on the second bit line section BLS21 starts on increasing, and the sense amplifier driving circuit 52a supplies current to the sense amplifier circuits 44aa to 44an together with the sense amplifier driving circuit 52b. The word line WL1 is recovered to the low voltage level Vss at time t17, and the data bit read-out from the memory cell M11 is rewritten into the memory cell M11 within time period t2. The data bits read out from the other memory cells M12 to M1n are refreshed in a similar manner to the data bit rewritten into the memory cell M11.

Since both sense amplifier driving circuits 52a and 52b supply current to the sense amplifier circuits 44aa to 44an, the small difference on the second bit line section BLS21 is rapidly increased within time period t2. Even though time period t2 is shrunk, the voltage difference on the second bit line section BLS21 is large enough to conserve a bit of data information represented by the data bit stored in the memory cell M11, and the dual power supply system surely improves the access speed as well as the reliability of the random access memory device.

Second Embodiment

Figure 8:
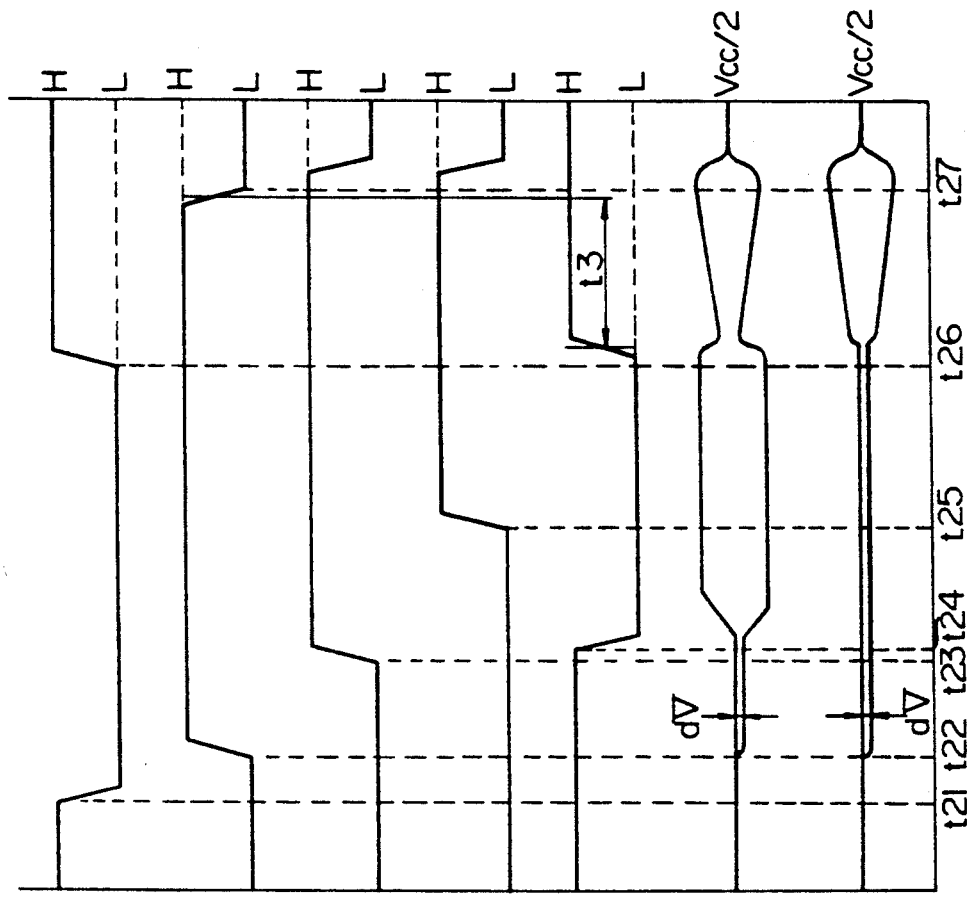
FIG. 8 is a diagram showing the waveforms of essential signals produced in another random access memory device according to the present invention.

Turning to FIG. 8, a refreshing operation of another random access memory device embodying the present invention is illustrated. The second embodiment is similar in circuit arrangement to the first embodiment except for a control signal generating unit corresponding to the control signal generating unit 52, and the control signal generating unit incorporated in the second embodiment produces internal control signals in a different sequence. The other component units, transistors and control signals are designated by the same references used in FIGS. 4 to 6 in the following description.

Assuming now that the row address strobe signal RAS goes down to the low voltage level at time t21, the row address bits are latched in the row address decoder unit 47, and the row address bits allow the word line driver circuit 48a to lift up the word lines WL1 at time t22. Although not shown in the drawings, the memory cell arrays 42a and 42b are associated with respective precharging units. The precharging signal PC had caused the precharging unit to precharge the bit line pairs BLP1 to BLPn to the precharging voltage level Vcc/2, and the bit line pairs BLP1 to BLPn were isolated from the precharging circuit. The switching transistors Qn61 of the memory cells M11 to M1n concurrently turn on to couple the storage capacitors CP to the second bit line sections BLS21 to BLS2n. Since the source node of the switching transistor Qn61 of the memory cell M11 is lower than the drain node thereof, a small amount of decay dV takes place on the second bit line section BLS21 immediately after time t22, and the decay dV is propagated through the transfer gate unit 43a to the first bit line section BLS11.

At time t23, the second control signal CTL12 goes up to a high voltage level, and the p-channel type field effect transistor Qp69 and the n-channel type field effect transistor Qn70 turn on to couple the first and third voltage sources Vc2 and Vs2 to the first and second voltage lines 61 and 62, respectively. Then, the sense amplifier circuit 44aa as well as the other sense amplifier circuits 44ab to 44an are activated to increase the small difference dV on the bit line pairs BLP1 to BLPn. Namely, the n-channel type field effect transistor Qn65 and the p-channel type field effect transistor Qp64 of the sense amplifier circuit 44aa increase the channel conductances thereof and provide first and second current paths to the first and second voltage lines 61 and 62, respectively. However, the large parasitic capacitance coupled to the bit line pair BLP1 does not allow rapidly increasing the small difference dV. The fourth control signal CTL14 goes down to the low voltage level Vss at time t24, and the sense amplifier circuits 44aa to 44an are isolated from the second bit line sections BLS21 to BLS2n by the transfer gate unit 43a. Since the parasitic capacitance coupled to the second bit line section BLS21 is cut from the sense amplifier circuit 44aa, the sense amplifier circuit 44aa rapidly increases the small difference dV. The first bit line section BLS11 is driven to the power voltage level Vcc and the ground level Vss, however, the second bit line section BLS21 remains in the small difference dV.

Prior to recovery of the row address strobe signal RAS and the fourth control signal CTL14, the third control signal CTL13 goes up to the high voltage level at time t25, and the first and second voltage lines 61 and 62 are coupled through the sense amplifier driving circuit 52a to the second and fourth voltage sources Vc3 and Vs3. Although the differential amplification has been completed for the first bit line sections BLS11 to BLS1n, the second and fourth voltage sources Vc3 and Vs3 make the first bit line sections BLS11 to BLS1n less sensitive against undesirable noise.

At time t26, the row address strobe signal RAS is recovered to an inactive high voltage level, and the fourth control signal CTL14 goes up to a high voltage level immediately after time t26. Then, the n-channel type field effect transistors Qn62 concurrently turn on to interconnect the first bit line sections BLS11 to BLS1n to the second bit line sections BLS21 to BLS2n. Since the word line WL1 remains high, the memory cell M11 is electrically coupled to the second bit line section BLS21 and, accordingly, to the sense amplifier circuit 44aa. The sense amplifier circuit 44aa drives the second bit line section BLS21 as well as the storage capacitor CP of the memory cell M11. In this instance, since the sense amplifier driver circuit 52a has been activated, the sense amplifier circuit 44aa starts on increasing the small difference dV on the second bit line section BLS21 at an improved speed. At time t27, the word line WL1 is recovered to the low voltage level Vss, and the data bit read-out from the memory cell M11 is rewritten into the memory cell M11 within time period t3. The data bits read out from the other memory cells M12 to M1n are refreshed in a similar manner to the data bit rewritten into the memory cell M11.

The second embodiment allows the third control signal CTL13 to go up before the fourth control signal, and the second bit line sections BLS21 to BLS2n are driven by the sense amplifier circuits 44aa to 44an without any delay. This results in further improvement in a rewriting speed.

Although particular embodiments of the present invention have been shown and described, it will be obvious to those skilled in the art that various changes and modifications may be made without departing from the spirit and scope of the present invention.

What is claimed is:

1. A random access memory device comprising
   a) a plurality of dynamic memory cells arranged in rows and columns and storing data bits in the form of electric charges, respectively,
   b) a plurality of bit line pairs respectively coupled to the columns of said dynamic memory cells, and propagating small differences in voltage level corresponding to data bits,
   c) a plurality of sense amplifier circuits coupled to said bit line pairs, respectively, and selectively providing first current paths for charging current and second current paths for discharging current, thereby increasing said small differences in voltage level on said bit line pairs,
   d) a first controlling unit provided in association with row address bits and supporting propagation of data bits for a row of said dynamic random access memory cells, said first controlling unit having a first driving sub-unit for driving said plurality of sense amplifier circuits,
   e) a second controlling unit provided in association with column address bits and supporting propagation of one of said data bits for said row of said dynamic random access memory cells, said second controlling unit having a second driving sub-unit for driving said plurality of sense amplifier circuits, said first and second driving sub-units being coupled in parallel between a first pad supplied with a first voltage level and a second pad supplied with a second voltage level, wherein said first current paths and said second current paths of said sense amplifier circuits are electrically coupled to said first and second pads, respectively, through said first and second driving sub-units arranged in parallel between said first and second pads.

2. A dynamic random access memory device as set forth in claim 1, in which said random access memory device further comprises a transfer gate unit for dividing said plurality of bit line pairs into first bit line sections coupled to said sense amplifier circuits and second bit line sections coupled to said memory cells, said transfer gate unit being operative to isolate said first bit line sections from said second bit line sections after said small differences in voltage level take place on said respective second bit line sections, said transfer gate unit being further operative to interconnect said first bit line sections and said second bit line sections after said small differences in voltage level are increased by said sense amplifier circuits.

3. A random access memory device as set forth in claim 2, in which said first driving sub-unit couples said first and second current paths to said first and second pads at a first timing, and in which said transfer gate unit isolates said first bit line sections from said second bit line sections at a second timing after said first timing.

4. A random access memory device as set forth in claim 3, in which said transfer gate unit interconnects said first bit line sections and said second bit line sections at a third timing after said second timing, and in which said second driving sub-unit couples said first and second current paths to said first and second pads at a fourth timing after said third timing.

5. A random access memory device as set forth in claim 4, in which each of said sense amplifier circuits comprises a first series combination of a p-channel type first field effect transistor and an n-channel type second field effect transistor coupled between first and second voltage lines, and a second series combination of a p-channel type third field effect transistor and an n-channel type fourth field effect transistor coupled between said first and second voltage lines, a common drain node in one of said first and second series combinations being coupled to the gate electrodes of the field effect transistors of the other of said first and second series combinations, the common drain nodes being further coupled to the associated bit line pair, either said first or said third field effect transistor providing one of said first current paths, either said second or said fourth field effect transistor providing one of said second current paths, said first and second voltage lines being coupled to said first and second driving sub-units.

6. A random access memory device as set forth in claim 3, in which said driving circuits incorporated in the second controlling unit interconnect said first and second current paths to said fist and second pads at a fifth timing after said second timing, and in which said transfer gate unit interconnects said first bit line sections and said second bit line sections at a sixth timing after said fifth timing.

7. A random access memory device comprising
   a) a plurality of dynamic memory cells arranged in rows and columns and storing data bits in the form of electric charges, respectively,
   b) a plurality of bit line pairs respectively coupled to the columns of said dynamic memory cells, and propagating small differences in voltage level corresponding to data bits,
   c) a plurality of sense amplifier circuits coupled to said bit line pairs, respectively, and selectively providing first current paths for charging current and second current path for discharging current, thereby increasing said small differences in voltage level on said bit line pairs,
   d) a transfer gate unit coupled between said plurality of dynamic memory cells and said plurality of sense amplifier circuits and operative to isolate said plurality of sense amplifier circuits from said plurality of dynamic memory cells and to interconnect said plurality of sense amplifier circuits and said plurality of dynamic memory cells, e) first and second voltage sources coupled in parallel to a bonding pad supplied with a power voltage, f) third and fourth voltage sources coupled in parallel to a bonding pad supplied with a ground voltage, and g) a plurality of sense amplifier driver circuits divided into first and second driver circuit groups, said plurality of sense amplifier circuits being connectable through said first driver group to said first and third voltage sources and through said second driver group to said second and fourth voltage sources, in which said first driver group interconnecting said first and third voltage sources and said plurality of sense amplifier circuits at a first timing, said transfer gate unit isolating said first bit line sections from said second bit line sections at a second timing after said first timing, said transfer gate unit interconnecting said first bit line sections and said second bit line sections at a third timing after said second timing, said second driver group interconnecting said second and fourth voltage sources and said plurality of sense amplifier circuits at a fourth timing after said third timing.

* * * * *

UNITED STATES PATENT AND TRADEMARK OFFICE
CERTIFICATE OF CORRECTION

PATENT NO. : 5,295,111

DATED : March 15, 1994

INVENTOR(S) : Akira TSUJIMOTO

It is certified that error appears in the above-identified patent and that said Letters Patent is hereby corrected as shown below:

Col.mn 3, line 57, delete "shrunk".

Column 7, lines 28 and 29, delete "M11, M12, and M1n" and insert --MI1, MI2, and MIn--;

line 30, delete "M1n" and insert --MIn--;

line 34, delete "M1n" and insert --MIn--;

lines 35 and 36, delete "W1 to W1" and insert --W1 to WI--;

line 39, delete "M1n" and insert --MIn--.

Signed and Sealed this

Sixth Day of September, 1994

Attest:

BRUCE LEHMAN

*Attesting Officer*     *Commissioner of Patents and Trademarks*